(12) United States Patent
Zhang et al.

(10) Patent No.: US 10,388,672 B2
(45) Date of Patent: Aug. 20, 2019

(54) ARRAY SUBSTRATE AND MANUFACTURING METHOD THEREOF, DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Hepan Zhang, Beijing (CN); Qingnan Al, Beijing (CN); Yue Li, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 151 days.

(21) Appl. No.: 15/159,130

(22) Filed: May 19, 2016

(65) Prior Publication Data

US 2017/0012060 A1    Jan. 12, 2017

(30) Foreign Application Priority Data

Jul. 10, 2015    (CN) .......................... 2015 1 0405418

(51) Int. Cl.
*H01L 27/12*    (2006.01)

(52) U.S. Cl.
CPC .......... *H01L 27/124* (2013.01); *H01L 27/127* (2013.01); *H01L 27/1251* (2013.01); *H01L 27/1262* (2013.01)

(58) Field of Classification Search
CPC .. H01L 27/124; H01L 27/1251; H01L 27/127
See application file for complete search history.

(56) References Cited

U.S. PATENT DOCUMENTS

| 5,671,027 A | 9/1997 | Sasano et al. |
| 2009/0302318 A1* | 12/2009 | Chang .................. G02F 1/1333 257/59 |

(Continued)

FOREIGN PATENT DOCUMENTS

| CN | 103199060 A | 7/2013 |
| CN | 104269414 A | 1/2015 |
| CN | 104576650 A | 4/2015 |

OTHER PUBLICATIONS

Office Action dated May 27, 2017 issued in corresponding Chinese Application No. 201510405418.5.

*Primary Examiner* — Matthew E Warren
(74) *Attorney, Agent, or Firm* — Nath, Goldberg & Meyer; Joshua B. Goldberg

(57) ABSTRACT

A manufacturing method of an array substrate is disclosed. The manufacturing method includes a step of forming a pattern including a pixel electrode; and the manufacturing method further includes a step of forming a pattern including an active layer after the step of forming the pattern including the pixel electrode. Accordingly, an array substrate and a display device are also disclosed. In the manufacturing process of the array substrate, conductive material remained on the active layer is less, thereby producing less leak current, which in turn improves quality of the array substrate and display performance of the display device.

10 Claims, 3 Drawing Sheets

(56) References Cited

U.S. PATENT DOCUMENTS

| | | | |
|---|---|---|---|
| 2011/0013106 A1* | 1/2011 | Liu | G02F 1/136286 349/46 |
| 2015/0153600 A1* | 6/2015 | Won | H01L 27/127 349/43 |
| 2015/0293396 A1* | 10/2015 | Li | H01L 29/423 257/72 |
| 2016/0268317 A1 | 9/2016 | Wang | |

\* cited by examiner

ARRAY SUBSTRATE AND MANUFACTURING METHOD THEREOF, DISPLAY DEVICE

FIELD OF THE INVENTION

The present invention relates to the field of display technology, and particularly, to an array substrate and a manufacturing method thereof, a display device.

BACKGROUND OF THE INVENTION

With fast upgrading of display products, requirements for process index are improving continuously, and a manufacturing process of an array substrate is more and more complex and fine while improving yield and quality of product. In this case, a manufacturing process of an array substrate with multiple masks is presented in the prior art. At present, manufacturing of an array substrate mainly includes the following steps of: firstly, forming a gate metal layer on a substrate and forming a pattern including a gate through a first patterning process; then, forming a gate insulation layer and a semiconductor material layer, and forming an active layer through a second patterning process; then, forming a first conductive layer, and forming a pattern including a pixel electrode through a third patterning process; and then, forming other structures such as a source and a drain, a passivation layer and a common electrode.

However, when the array substrate is manufactured by the above method, after etching the first conductive layer to form the pixel electrode, a small amount of conductive material remains in the channel region, which leads to an increasing of leak current of a thin film transistor and an abnormal voltage in a pixel area, thereby causing defects such as a contamination of display and a crosstalk.

SUMMARY OF THE INVENTION

An object of various aspects of the present invention is to provide an array substrate and a manufacturing method thereof, and a display device for reducing the amount of conductive material remained in a channel region of an active layer, so as to improve display performance.

To achieve the above object, an aspect of the present invention provides a manufacturing method of an array substrate, which includes a step of forming a pattern including a pixel electrode; and the manufacturing method may further include a step of forming a pattern including an active layer after the step of forming the pattern including the pixel electrode.

The manufacturing method may further include a step of forming a pattern including a gate and forming a gate insulation layer before the step of forming the pattern including the pixel electrode; and the manufacturing method may further include a step of forming a buffering insulation layer between the step of forming the pattern including the pixel electrode and the step of forming the pattern including the active layer.

After the step of forming the pattern including the active layer, the manufacturing method may further include steps of:

forming a via at a position of the buffering insulation layer corresponding to the pixel electrode; and forming a pattern including a source and a drain, the drain being connected with the pixel electrode through the via.

The manufacturing method may further include a step of:

forming a source ohmic contact layer between the source and the active layer, and forming a drain ohmic contact layer between the drain and the active layer.

The step of forming the source ohmic contact layer and the drain ohmic contact layer may include:

forming a doped semiconductor material layer;

performing a first patterning process on the doped semiconductor material layer, so as to form a source-drain ohmic contact layer that covers the entire active layer; and performing a second patterning process on the source-drain ohmic contact layer, so as to form the spaced source ohmic contact layer and drain ohmic contact layer.

The step of forming the source-drain ohmic contact layer that covers the entire active layer and the step of forming the pattern including the active layer may be performed through a single patterning process; and the step of forming the spaced source ohmic contact layer and drain ohmic contact layer and the step of forming the pattern including the source and the drain may be performed through a single patterning process.

After the step of forming the pattern including the source and the drain, the manufacturing method may further include a step of:

forming a passivation layer.

The passivation layer and the buffering insulation layer may be formed by a vapor deposition method, and at least one of a material of the passivation layer and a material of the buffering insulation layer may include silicon nitride. The chamber pressure when forming the passivation layer may be between 1400 mT and 1600 mT, and the chamber pressure when forming the buffering insulation layer may be between 1100 mT and 1300 mT.

After the step of forming the passivation layer, the manufacturing method may further include a step of:

forming a pattern including a common electrode, the common electrode including a plurality of common electrode strips.

Accordingly, another aspect of the present invention further provides an array substrate, which includes a thin film transistor and a pixel electrode, wherein the pixel electrode is located under a layer where an active layer of the thin film transistor is located, and is insulated and spaced from the active layer, the pixel electrode being electrically connected with a drain of the thin film transistor.

A buffering insulation layer may be provided between the active layer of the thin film transistor and the pixel electrode.

A via may be provided at a position of the buffering insulation layer corresponding to the pixel electrode, the drain of the thin film transistor being connected with the pixel electrode through the via.

A source ohmic contact layer may be provided between a source and the active layer of the thin film transistor, and a drain ohmic contact layer may be provided between the drain and the active layer of the thin film transistor.

The array substrate may further include a passivation layer and a common electrode provided on the passivation layer, the common electrode including a plurality of common electrode strips, and the passivation layer covering the source and drain of the thin film transistor and the buffering insulation layer.

At least one of a material of the buffering insulation layer and a material of the passivation layer may include silicon nitride.

Accordingly, still another aspect of the present invention provides a display device, which includes the array substrate provided by the above aspect of the present invention.

In the manufacturing method of the array substrate provided by the above aspect of the present invention, as the step of forming the pattern including the pixel electrode is performed before the step of forming the pattern including the active layer (i.e., the semiconductor material layer for forming the active layer is formed after the pixel electrode has been manufactured), the conductive material that remains on the active layer is less, thereby the leak current is reduced, which in turn improves quality of the array substrate and display performance of the display device.

BRIEF DESCRIPTION OF THE DRAWINGS

Accompanying drawings are used for providing further understandings of the present invention, constitute as a part of the specification, and are used to explain the present invention in conjunction with the following specific implementations, but not to restrict the present invention. In the drawings.

DETAILED DESCRIPTION OF THE EMBODIMENTS

Figure 1:
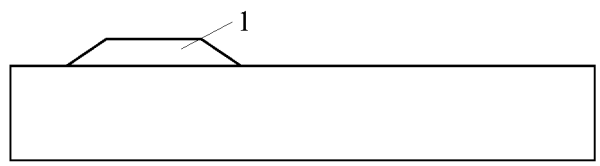
FIG. 1 is a schematic diagram of forming a gate in a manufacturing method of an array substrate provided by an aspect of the present invention.

Specific implementations will be described in details below in conjunction with the accompanying drawings. It should be understood that the specific implementations described herein are merely used for explaining and illustrating the present invention, but not for limiting the present invention.

As a first aspect of the present invention, there is provided a manufacturing method of an array substrate, which includes a step of:

forming a pattern including a pixel electrode; and the manufacturing method further includes a step of forming a pattern including an active layer after the step of forming the pattern including the pixel electrode.

Specifically, when forming the pixel electrode, a transparent conductive material layer (e.g., indium tin oxide) is formed firstly, and then a pattern including the pixel electrode is formed by etching the transparent conductive material layer through a patterning process, in which a photoresist layer is formed on the transparent conductive material layer; then, the photoresist layer is exposed and developed to remain a portion of the photoresist corresponding to the pixel electrode area and remove the photoresist at other portions; then, the transparent conductive material layer is etched, so that the transparent conductive material not covered by the photoresist is etched off; and finally, the residues of the photoresist is removed. When forming the active layer, it is possible to firstly form a semiconductor material layer and then etch the semiconductor material layer through the same patterning process, details of which will not be described repeatedly. It can be understood that the position relationship between the pixel electrode and the active layer is that a projection of the pixel electrode on a substrate is at a side of a projection of the active layer on the substrate.

The step of forming the pattern including the active layer is performed after the step of forming the pattern including the pixel electrode. That is, the semiconductor material layer is formed after the pixel electrode has been manufactured.

Implementations of the present invention are particularly suitable for the array substrate of ADS (Advanced Super Dimension Switch) mode, in which the pixel electrode and the common electrode are provided on the array substrate and the pixel electrode is formed on the gate insulation layer so as to increase aperture ratio. In the manufacturing method of the array substrate provided by the above aspect of the present invention, as the step of forming the pattern including the pixel electrode is performed before the step of forming the pattern including the active layer (i.e., the semiconductor material layer for forming the active layer is formed after the pixel electrode has been manufactured), the conductive material that remains on the active layer is less, thereby reducing the leak current, which in turn improves quality of the array substrate and display performance of the display device.

Figure 2:
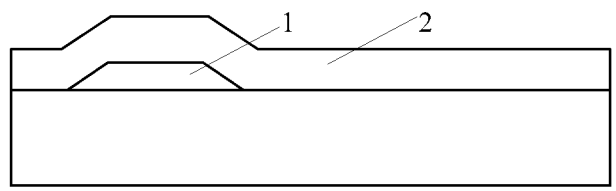
FIG. 2 is a schematic diagram of forming a gate insulation layer.
Figure 4:
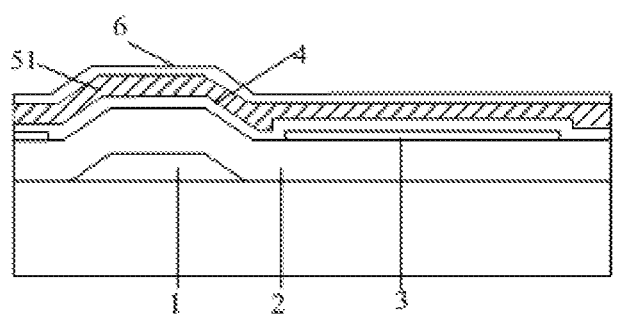
FIG. 4 is a schematic diagram of forming a buffering insulation layer, a semiconductor material layer and a doped semiconductor layer.

As a specific implementation of the present invention, before the step of forming the pattern including the pixel electrode, the manufacturing method further includes:

forming a pattern including a gate 1 and forming a gate insulation layer (as shown in FIG. 1 and FIG. 2); and between the step of forming the pattern including the pixel electrode and the step of forming the pattern including the active layer, the manufacturing method further includes:

forming a buffering insulation layer 4 (as shown in FIG. 4).

Specifically, both of the material of the buffering insulation layer 4 and the material of the gate insulation layer 2 may include silicon nitride, wherein, the buffering insulation layer 4 and the gate insulation layer 2 may be formed through a vapor deposition method, and the depositing rate of the buffering insulation layer 4 may be smaller than that of the gate insulation layer 2, so as to reduce defects in the buffering insulation layer 4, thereby the buffering insulation layer 4 can better contact the active layer, protect the pixel electrode 3, and prevent effects of processing gas on the pixel electrode 3 in the subsequent formations of films.

Figure 6:
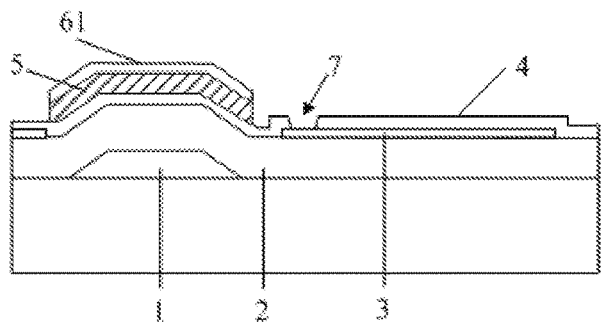
FIG. 6 is a schematic diagram of forming a via in the buffering insulation layer.
Figure 8:
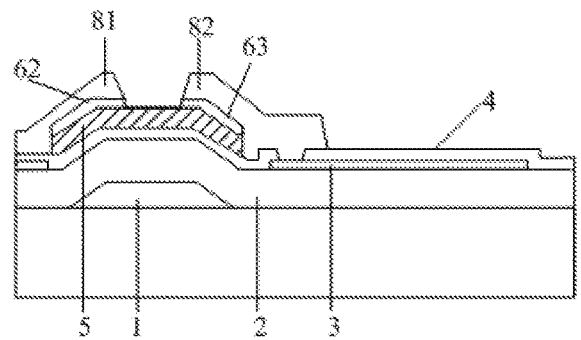
FIG. 8 is a schematic diagram of forming a source, a drain, a source ohmic contact layer and a drain ohmic contact layer.

Further, after the step of forming the pattern including the active layer, the manufacturing method further includes:

forming a via 7 at a position of the buffering insulation layer 4 corresponding to the pixel electrode 3 (as shown in FIG. 6); and forming a pattern including a source 81 and a drain 82, the drain 82 being connected with the pixel electrode 3 through the via 7, as shown in FIG. 8.

In the prior art, a gate insulation layer and an active layer are formed successively, that is, the gate insulation layer and a semiconductor material layer for forming the active layer are formed successively. And in the process of the successive formations, foreign materials may present on the gate insulation layer, which easily lead to a short between thus formed source and drain and a pixel electrode formed on the gate insulation layer. In contrast, in the implementation of the present invention, the buffering insulation layer 4 is formed between the formation of the pixel electrode 3 and the formation of the active layer 5. The pixel electrode 3 and the source 81 and drain 82 are insulated and spaced by the buffering insulation layer 4, so that a possibility of the short between the pixel electrode 3 and the source 81 and drain 82 is reduced.

Further, the manufacturing method also includes:

forming a source ohmic contact layer 62 between the source 81 and the active layer 5, and forming a drain ohmic contact layer 63 between the drain 82 and the active layer 5, as shown in FIG. 8, thereby reducing contact resistances between the source 81, the drain 82 and the active layer 5.

Figure 5:
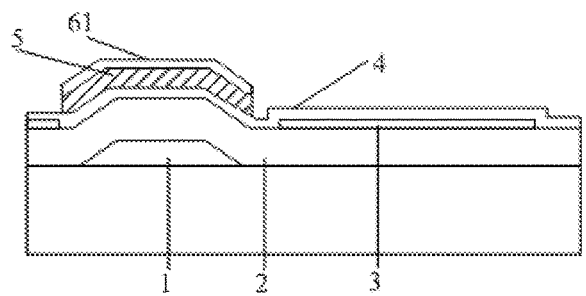
FIG. 5 is a schematic diagram of forming a semiconductor layer and a source-drain ohmic contact layer.

Specifically, the step of forming the source ohmic contact layer 62 and forming the drain ohmic contact layer 63 includes:

forming a doped semiconductor material layer 6, as shown in FIG. 4;

performing a first patterning process on the doped semiconductor material layer 6, so as to form a source-drain ohmic contact layer 61 that covers the entire active layer 5, as shown in FIG. 5; and performing a second patterning process on the source-drain ohmic contact layer 61, so as to form the spaced source ohmic contact layer 62 and drain ohmic contact layer 63, as shown in FIG. 8.

Optionally, the step of forming the source-drain ohmic contact layer 61 and the step of forming the pattern including the active layer 5 may be performed through a single patterning process, so as to simplify the manufacturing process; and the step of forming the spaced source ohmic contact layer 62 and drain ohmic contact layer 63 and the step of forming the pattern including the source 81 and the drain 82 are performed through a single patterning process, so as to simplify the manufacturing process.

Being performed through a single patterning process means a patterning is performed through a single mask. The step of forming the pattern including the active layer 5 includes forming a semiconductor material layer firstly and then performing a patterning process on the semiconductor material layer. The step of forming the pattern including the source and the drain includes forming a source-drain metal layer firstly and then performing a patterning process on the source-drain metal layer.

The step of forming the source-drain ohmic layer 61 and the step of forming the pattern including the active layer 5 are performed through a single patterning process means the patterning process performed on the semiconductor material layer and the patterning process performed on the doped semiconductor material layer 6 are a single patterning process. The step of forming the spaced source ohmic contact layer 62 and drain ohmic contact layer 63 and the step of forming the pattern including the source 81 and the drain 82 are performed through a single patterning process means the patterning process performed on the source-drain ohmic contact layer 61 and the patterning process performed on the source-drain metal layer are a single patterning process.

Figure 9:
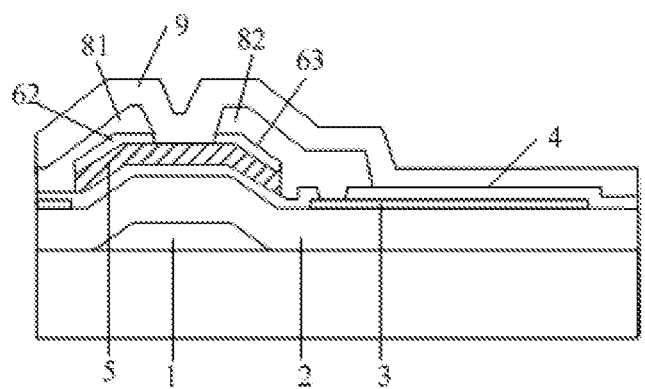
FIG. 9 is a schematic diagram of forming a passivation layer.

Further, after the step of forming the pattern including the source and the drain, the manufacturing method also includes:

forming a passivation layer 9, as shown in FIG. 9, the passivation layer 9 covering the source 81, the drain 82 and the buffering insulation layer 4. The passivation layer 9 has a protection function for a channel region of the active layer 5. Contacted portions of the passivation layer 9 and the buffering insulation layer 4 can be regarded as a passivation structure in a whole.

Specifically, in the implementation of the present invention, the passivation layer 9 and the buffering insulation layer 4 are formed by a vapor deposition method.

In the prior art, when manufacturing an array substrate, a first passivation layer and a second passivation layer located above the first passivation layer are formed successively, wherein the first passivation layer directly contacts a pixel electrode and the first and second passivation layers are formed as a passivation structure. The first passivation layer and the second passivation layer are formed by a chemical vapor deposition method. When depositing the first passivation layer, a process condition of high vacuum and low pressure is employed, such that abnormal discharge tends to occur between electrodes of process apparatus, causing potential issues of apparatus and process. In the implementation of the present invention, when forming the buffering insulation layer (material of which may be the same as the first passivation layer), a chamber pressure could be appropriately increased, thereby reducing possibility of abnormal discharge between electrodes of the process apparatus.

More specifically, both of the material of the passivation layer 9 and the material of buffering insulation layer 4 may include silicon nitride, the chamber pressure when forming the passivation layer 9 is between 1400 mT and 1600 mT, and the chamber pressure when forming the buffering insulation layer 4 is between 1100 mT and 1300 mT.

Figure 10:
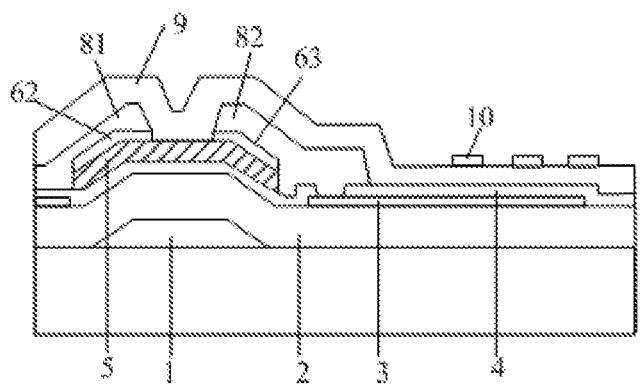
FIG. 10 is a schematic diagram of forming a common electrode.

Further, after the step of forming the passivation layer, the manufacturing method also includes:

forming a pattern including a common electrode, as shown in FIG. 10, the common electrode including a plurality of common electrode strips.

Next, the manufacturing method of the array substrate will be described in conjunction with FIG. 1 to FIG. 10.

At S1, a gate metal layer is formed on a substrate, and a patterning process is performed on the gate metal layer so as to form a pattern including a gate 1, as shown in FIG. 1.

At S2, as shown in FIG. 2, a gate insulation layer 2 is formed on the substrate with the gate 1 formed thereon.

Figure 3:
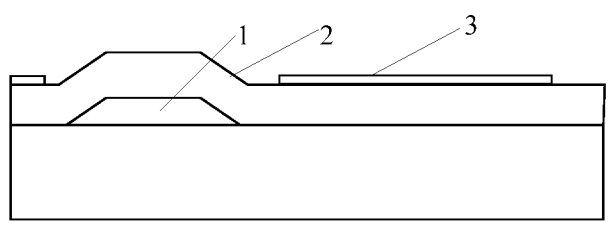
FIG. 3 is a schematic diagram of forming a pixel electrode.

At S3, a conductive material layer is formed on the gate insulation layer 2, and a patterning process is performed on the conductive material layer so as to form a pattern including a pixel electrode 3, as shown in FIG. 3.

At S4, a buffering insulation layer 4, a semiconductor material layer 51 and a doped semiconductor material layer 6 are respectively formed, as shown in FIG. 4, and a patterning process is performed on the semiconductor material layer 51 and the doped semiconductor material layer 6 so as to form an active layer 5 and a source-drain ohmic contact layer 61, as shown in FIG. 5.

At S5, a via 7 is formed at a position of the buffering insulation layer 4 corresponding to the pixel electrode 3, as shown in FIG. 6.

Figure 7:
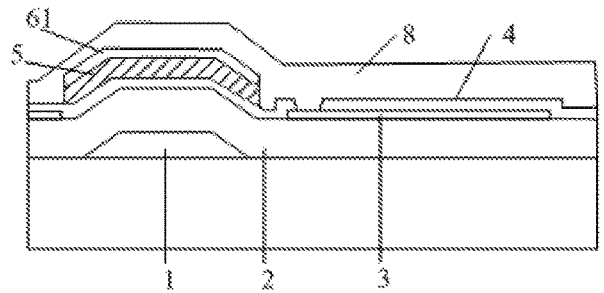
FIG. 7 is a schematic diagram of forming a source-drain metal layer.

At S6, a source-drain metal layer 8 is formed, as shown in FIG. 7, and a patterning process is performed on the source-drain metal layer 8 so as to form a source 81 and a drain 82 while etching off a portion of the source-drain ohmic contact layer 61 corresponding to a channel region to form a source ohmic contact layer 62 and a drain ohmic contact layer 63, as shown in FIG. 8.

At S7, a passivation layer 9 is formed on the substrate formed with the source 81 and the drain 82 thereon, as shown in FIG. 9.

At S8, a pattern including a common electrode is formed, the common electrode including a plurality of common electrode strips, as shown in FIG. 10.

As a second aspect of the present invention, there is provided an array substrate, which is manufactured by the manufacturing method provided by the first aspect of the present invention. Specifically, the array substrate may include a thin film transistor and a pixel electrode 3. As shown in FIG. 10, the pixel electrode 3 is located under a layer where an active layer 5 of the thin film transistor is located, and is insulated and spaced from the active layer 5, the pixel electrode 3 being electrically connected with a drain 82 of the thin film transistor.

Further, as shown in FIG. 10, a buffering insulation layer 4 is provided between the active layer 5 of the thin film transistor and the pixel electrode 3, and the active layer 5 is provided on the buffering insulation layer 4. Thus, the pixel electrode 3 which is located at a layer under the active layer 5 will not leave residues on the active layer, and the buffering insulation layer 4 can somewhat have a protection function for the pixel electrode 3, reducing effects of large gas flow on the pixel electrode 3 in the deposition process of the passivation layer, so that the yield of the array substrate is improved.

Specifically, a via is provided at a position of the buffering insulation layer 4 corresponding to the pixel electrode 3, and the drain 82 of the thin film transistor is connected with the pixel electrode 3 through the via.

Further, a source ohmic contact layer 62 is provided between the source 81 and the active layer 5 of the thin film transistor, and a drain ohmic contact layer 63 is provided between the drain 82 and the active layer 5 of the thin film transistor, so as to reduce the contact resistances between the source 81, the drain 82 and the active layer 5.

Further, as shown in FIG. 10, the array substrate further includes a passivation layer 9 and a common electrode provided on the passivation layer 9. The common electrode includes a plurality of common electrode strips, and the passivation layer 9 covers the source 81 and the drain 82 of the thin film transistor and the buffering insulation layer 4.

Specifically, both of the material of the buffering insulation layer 4 and the material of the passivation layer 9 may include silicon nitride.

As a third aspect of the present invention, there is provided a display device, which includes the array substrate provided by the second aspect of the present invention. As the yield of the array substrate according to the second aspect of the present invention is improved, the yield of the display device including the array substrate is also improved.

It can be understood that the foregoing implementations are merely exemplary embodiments used for explaining the principle of the present invention, but the present invention is not limited thereto. Various modifications and improvements can be made by those skilled in the art without departing from the spirit and essence of the present invention, and those modifications and improvements shall also be regarded as the protection scope of the present invention.

What is claimed is:

1. A manufacturing method of an array substrate, which includes a step of forming a pattern including a pixel electrode; and
    the manufacturing method further includes a step of forming a pattern including an active layer after the step of forming the pattern including the pixel electrode,
    wherein the manufacturing method further includes a step of forming a pattern including a gate and forming a gate insulation layer before the step of forming the pattern including the pixel electrode; and
    the manufacturing method further includes a step of forming a buffering insulation layer between the step of forming the pattern including the pixel electrode and the step of forming the pattern including the active layer.

2. The manufacturing method according to claim 1, wherein after the step of forming the pattern including the active layer, the manufacturing method further includes steps of:
    forming a via at a position of the buffering insulation layer corresponding to the pixel electrode; and
    forming a pattern including a source and a drain, the drain being connected with the pixel electrode through the via.

3. The manufacturing method according to claim 2, wherein the manufacturing method further includes a step of:
    forming a source ohmic contact layer between the source and the active layer, and forming a drain ohmic contact layer between the drain and the active layer.

4. The manufacturing method according to claim 3, wherein the step of forming the source ohmic contact layer and the drain ohmic contact layer includes:
    forming a doped semiconductor material layer;
    performing a first patterning process on the doped semiconductor material layer, so as to form a source-drain ohmic contact layer that covers the entire active layer; and
    performing a second patterning process on the source-drain ohmic contact layer, so as to form the spaced source ohmic contact layer and drain ohmic contact layer.

5. The manufacturing method according to claim 4, wherein the step of forming the source-drain ohmic contact layer that covers the entire active layer and the step of forming the pattern including the active layer are performed through a single patterning process; and
    the step of forming the spaced source ohmic contact layer and drain ohmic contact layer and the step of forming the pattern including the source and the drain are performed through a single patterning process.

6. The manufacturing method according to claim 2, wherein after the step of forming the pattern including the source and the drain, the manufacturing method further includes a step of:
    forming a passivation layer.

7. The manufacturing method according to claim 6, wherein the passivation layer and the buffering insulation layer are formed by a vapor deposition method, and at least one of a material of the passivation layer and a material of the buffering insulation layer including silicon nitride, the chamber pressure when forming the passivation layer being between 1400 mT and 1600 mT, and the chamber pressure when forming the buffering insulation layer being between 1100 mT and 1300 mT.

8. The manufacturing method according to claim 6, wherein after the step of forming the passivation layer, the manufacturing method further includes a step of:
    forming a pattern including a common electrode, the common electrode including a plurality of common electrode strips.

9. The manufacturing method according to claim 1, wherein the gate is formed on a substrate, the gate insulation layer is formed on a side of the gate away from the substrate, and the pixel electrode is formed on a side of the gate insulation layer away from the gate.

10. The manufacturing method according to claim 9, wherein the buffering insulation layer is formed on a side of the pixel electrode away from the gate insulation layer.

* * * * *